United States Patent
Ward et al.

[11] Patent Number: 5,928,430
[45] Date of Patent: *Jul. 27, 1999

[54] AQUEOUS STRIPPING AND CLEANING COMPOSITIONS CONTAINING HYDROXYLAMINE AND USE THEREOF

[75] Inventors: Irl E. Ward, Bethlehem; Francis Michelotti, Easton, both of Pa.

[73] Assignee: Advanced Scientific Concepts, Inc., Santa Barbara, Calif.

[*] Notice: This patent is subject to a terminal disclaimer.

[21] Appl. No.: 08/855,880

[22] Filed: May 12, 1997

Related U.S. Application Data

[63] Continuation-in-part of application No. 08/590,883, Jan. 24, 1996, abandoned, which is a continuation of application No. 08/501,206, Jul. 11, 1995, Pat. No. 5,556,482, which is a continuation-in-part of application No. 08/433,677, May 4, 1995, abandoned, which is a continuation-in-part of application No. 07/983,257, Nov. 30, 1992, Pat. No. 5,417,877, which is a continuation-in-part of application No. 07/647,487, Jan. 25, 1991, abandoned.

[51] Int. Cl.$^6$ .............................. C11D 3/20; C11D 3/30; B08B 3/04
[52] U.S. Cl. ................... 134/1.3; 134/3; 134/38; 510/175; 510/176; 510/435; 510/405
[58] Field of Search .................... 134/1.3, 3, 38; 510/175, 176, 435, 405

[56] References Cited

U.S. PATENT DOCUMENTS

| | | | |
|---|---|---|---|
| 4,626,411 | 12/1986 | Nemes et al. | 422/13 |
| 5,106,581 | 4/1992 | Jaunakais et al. | 422/56 |
| 5,279,771 | 1/1994 | Lee | 252/548 |
| 5,308,745 | 5/1994 | Schwartzkopf | 430/329 |
| 5,334,332 | 8/1994 | Lee | 252/548 |
| 5,417,877 | 5/1995 | Ward | 252/153 |
| 5,419,779 | 5/1995 | Ward | 134/38 |
| 5,482,566 | 1/1996 | Lee | 134/42 |
| 5,496,491 | 3/1996 | Ward et al. | 252/153 |
| 5,556,482 | 9/1996 | Ward et al. | 134/38 |
| 5,648,324 | 7/1997 | Honda et al. | 510/176 |

*Primary Examiner*—Mark Kopec
*Assistant Examiner*—Gregory R. Delcotto
*Attorney, Agent, or Firm*—Gottlieb, Rackman & Reisman, P.C.

[57] ABSTRACT

An aqueous stripping composition comprising a mixture of about 55% to 70% by weight of a polar amine solvent, about 22.5 to 15% by weight of a basic amine, especially hydroxylamine, a corrosion inhibitor and water. The stripping composition is effective for stripping photoresists, residues from plasma process generated organic, metal-organic materials, inorganic salts, oxides, hydroxides or complexes in combination with or exclusive of organic photoresist films at low temperatures.

2 Claims, 1 Drawing Sheet

AQUEOUS STRIPPING AND CLEANING COMPOSITIONS CONTAINING HYDROXYLAMINE AND USE THEREOF

RELATED APPLICATIONS

This application is a continuation-in-part of Ser. No. 590,883 filed Jan. 24, 1996, now abandoned, which is a continuation of Ser. No. 08/501,206 filed Jul. 11, 1995, now U.S. Pat. No. 5,556,482, which is a continuation-in-part of Ser. No. 08/433,677 filed May 4, 1995, abandoned, which is a continuation-in-part of Ser. No. 07/983,257 filed Nov. 30, 1992, now U.S. Pat. No. 5,417,877, which is a continuation-in-part of Ser. No. 07/647,487 filed Jan. 25, 1991, abandoned.

BACKGROUND OF THE INVENTION

1. Field of the Invention

This invention relates to aqueous stripping compositions particularly useful for stripping paints, varnishes, enamels, photoresists and the like, from various substrates. More particularly, the invention relates to improved aqueous stripping compositions comprising polar solvents such as alkanolamines, basic amines such as hydroxylamine and water.

2. Description of the Prior Art

Stripping compositions used for removing coatings from substrates have for the most part been highly flammable compositions, compositions generally hazardous to both humans and the environment and compositions which are reactive solvent mixtures evidencing an undesirable degree of toxicity. Moreover, these stripping compositions are not only toxic but their disposal is costly since they must be disposed of as a hazardous waste. In addition, these stripping compositions generally have severely limited bath life and, for the most part, are not recyclable or reusable.

Generally, compositions containing chlorinated hydrocarbons and/or phenolic compounds or other highly caustic and corrosive materials have been employed as stripping compositions for stripping paints, varnishes, lacquers, enamels, photoresists, powder coatings and the like, from substrates such as wood, metal or silicon wafers. Hot caustic compositions are generally employed to remove coatings from metals and methylene chloride compositions to remove coatings from wood. In many cases, the components of the stripping compositions are relatively toxic reactive solvent mixtures and thus must be subject to stringent use conditions and require hazardous chemical handling procedures and wearing of safety garments and apparel by users so as to avoid contact with the stripping compositions.

Additionally, because many of the toxic components of such stripping compositions are highly volatile and subject to unduly high evaporation rates, the stripping compositions require special human and environmental safety precautions to be taken during storage and use of said compositions.

In photoresist stripping with the use of hydroxylamine and an amine solvent there is the problem with the substrate of titanium etching and aluminum etching. It is therefore desirable to provide a corrosion inhibitor so that such compositions can be used on a various kinds of photoresists.

U.S. Pat. No. 4,276,186 to Bakos et al discloses a cleaning composition which includes N-methyl-2-pyrrolidone and an alkanolamine. However, in a comparative study, applicant has found that the use of N-methyl-2-pyrrolidone does not provide a broad spectrum of cleaning as is capable with the composition of the invention.

U.S. Pat. No. 4,617,251 to Sizensky discloses a stripping composition which is prepared with a select amine and an organic polar solvent. The composition is formed utilizing from about 2 to about 98% by weight of amine compound and about 98 to about 2% of an organic polar solvent.

U.S. Pat. No. 4,770,713 to Ward et al. discloses a stripping composition comprising an alkylamide and an alkanol amine.

U.S. Pat. No. 5,419,779 to Ward et al. discloses a process for removing an organic coating from a substrate by applying a composition consisting of about 62% by weight of monothanolamine, about 19% by weight hydroxylamine, a corrosion inhibitor which includes gallic acid and gallic acid esters, and water.

U.S. Pat. No. 5,496,491 to Ward et al., which is incorporated herein by reference, discloses a photoresist stripping composition comprising a basic amine, a polar solvent and an inhibitor which is the reaction product of an alkanolamine and a bicyclic compound. However, gallic acid and gallic acid esters are not disclosed as inhibitors.

U.S. Pat. Nos. 5,334,332 and 5,275,771 to Lee disclose a composition containing hydroxylamine, an alkanolamine and a chelating agent. However, the chelating agent is not gallic acid or its esters.

U.S. Pat. No. 5,597,420 to Ward et al. discloses a stripping composition free of hydroxylamine compounds which consists essentially of monoethanolamine and water together with a corrosion inhibitor. The inhibitor includes gallic acid and its esters.

Recently, OSHA, EPA and other similar federal, state and local governmental regulatory agencies have advocated a shift toward use of more human and environmentally compatible stripping compositions and stripping methods that are not subject to the aforementioned drawbacks and problems.

Moreover, heretofore available photoresist stripping compositions have required unduly long residence times or repeated applications in order to remove certain coatings. In addition, various coatings have resisted removal from certain substrates with these heretofore available stripping compositions. That is, these previously available stripping compositions have not provided adequate or complete removal of certain hard-to-remove coatings from various substrates.

It is, therefore, highly desirable to provide stripping compositions that exhibit substantially no human or environmental toxicity, are water miscible and are biodegradable. It is also desirable to provide stripping compositions that are substantially non-flammable, non-corrosive, evidence relatively little, if any, tendency to evaporate and are generally unreactive and also of little toxicity to humans and are environmentally compatible.

Moreover, it would be desirable to provide photoresist stripping compositions that have a high degree of stripping efficacy and particularly such high degree of stripping at lower temperatures than generally required with prior stripping compositions.

It is also highly desirable that photoresist stripping compositions be provided that exhibit substantially no corrosive effects on the substrate, especially those containing titanium and/or aluminum or silicon.

It is also desirable that effective stripping compositions be provided that are devoid of undesirable chlorinated or phenolic components and which do not require the use of hot caustic components. Highly desirable are stripping compositions and use thereof that are not considered undesirable by regulatory agencies overseeing their production and use.

It is also most advantageous that stripping compositions be provided with the above-identified desirable characteristics which evidence synergistic stripping action in that the mixtures of components provide stripping efficacy and stripping results not always obtainable with the individual components for the removal of sidewall organometallic and metal oxide residues.

SUMMARY OF THE INVENTION

It has now been found that a suitable stripping and cleaning composition in which the hereinbefore mentioned disadvantages or drawbacks are eliminated or substantially reduced and in which the range of usefulness of the stripping compositions is greatly extended can be obtained in accordance with the teachings of the present invention.

The novel stripping compositions of the present invention comprise the admixture of:

(a) from about 55% to about 70% by weight of a solvent selected from the groups consisting of 2-(2-aminoethoxy) ethanol, N-methylethanolamine (NMEA), N, N-dimethanolamine, isopropanolamine, 2-(2-aminoethylamino) ethanol and diethanolamine;

(b) from about 22.5% to about 15% by weight of hydroxylamine;

(c) an effective amount of corrosion inhibitor which is a compound of the general formula:

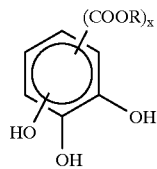

(I)

wherein R is hydrogen or lower alkyl, and X is 1 or 2; and (d) the remainder being water.

Hydroxylamine is commercially available as a 50% aqueous solution. The corrosion inhibitor is believed to form a 5- or 6-membered ring coordination complex with the substrate. Gallic acid is a more effective inhibitor than catechol because it is a more effective oxygen scavenger and has more sites for ligand attachment. That is, gallic acid has more effective coordination and/or coordinate covalent bonding capabilities. A preferred amount of inhibitor is about 0.1 to 10% by weight.

The novel stripping compositions of the invention exhibit synergistically enhanced stripping action and stripping capabilities at low temperatures not possible from the use of the individual components or in combination with other stripping components.

It is a general object of the invention to provide a stripping composition which is effective at low temperatures.

It is another object of the invention to provide a photoresist stripping composition which is non-corrosive especially of aluminum, aluminum alloys and silicon.

It is still another object of the invention to provide an inhibitor which is of simlar expense and is more effective and less toxic as a corrosion inhibitor than catechol.

It is a still further object of the invention to provide a stripping composition comprising hydroxylamine and an amine solvent which an improvement over monoethanolamine (MEA) as the amine solvent.

It is yet another object of the invention to provide a method for stripping a coated substrate which can be accomplished at low temperatures which increases both life and further reduces corrosion propensity.

Other objects and advantages of the present invention will be more fully understood in view of the accompanying drawing and a description of the preferred embodiments.

DETAILED DESCRIPTION OF THE PREFERRED EMBODIMENTS

Figure 1A:
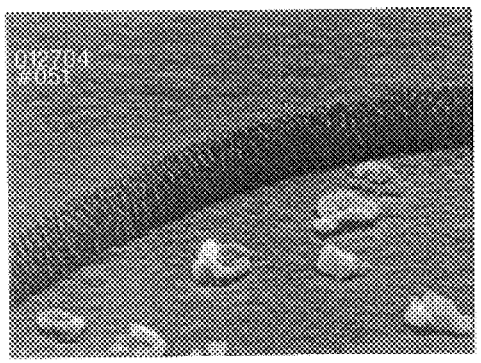
FIGS. 1A–1D show a SEM comparison between a formulation of the invention with gallic acid and a similar formulation with catechol.

The stripping compositions of the invention preferably comprise an admixture of:

(a) about 55% to about 70% by weight of an alkanolamine solvent selected from the groups consisting of 2-(2-aminoethoxy)ethanol, N-methylethanolamine (NMEA), N,N-dimethanolamine, isopropanolamine, 2-(2-aminoethylamino) ethanol and diethanolamine;

(b) about 22.5 to about 15% by weight of hydroxylamine, (HA)

(c) about 0.1 to 10% by weight of a corrosion inhibitor which is a compound of the general formula:

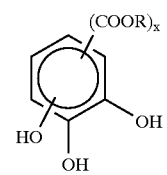

(I)

wherein R is hydrogen or lower alkyl, and X is 1 or 2; and (d) the remainder water, generally from the hydroxylamine solution.

A preferred photoresist stripping composition consists of about 58 to 63% by weight of 2-(2-aminolthoxy) ethanol, about 19% by weight of hydroxylamine, about 0.1 to 8% by weight of gallic acid and water.

Hydroxylamine (HA) is commercially available as a 50% aqueous solution. If desired, up to about 10% by weight of anthranilic acid may also be added as a corrosion inhibitor.

The stripping compositions of this invention are especially useful and advantageous for numerous reasons among which may be mentioned the following. The stripping compositions are water soluble, non-corrosive, non-flammable and of low toxicity to the environment. The stripping compositions evidence higher stripping efficiency at low temperatures for a wide variety of coatings and substrates. They are particularly suitable for removal of photoresists and residues from plasma processing used in integrated circuit fabrication since they also inhibit the redeposition of metal ions, especially sodium and potassium ions and prevent corrosion of metal and alloy substrates (i.e. Al, W, Ti, Si, Cu and alloys thereof).

The stripping compositions are easily prepared by simply mixing the components at room temperature. Preferably, the hydroxylamine is a water solution with the amine solvent. The corrosion inhibitor is then combined with the mixture.

The method of the invention is carried out by contacting an organic or metal-organic polymer, inorganic salt, oxide, hydroxide or complex or combination thereof as a film or residue, (i.e. sidewall polymer (SWP)) formed during "plasma etching or ashing". The actual conditions, i.e., temperature, time, etc. depend on the nature and thickness of the complex (photoresist and/or sidewall polymer) material to be removed, as well as other factors familiar to those skilled in the art. In general, for photoresist stripping, the photoresist coated substrate is contacted or dipped into a vessel containing the stripping composition at a temperature between 25–85° C. for a period of about 5–30 minutes, rinsed with water and then dried with an inert gas or spun dried.

Examples of organic polymeric materials include photoresists, electron beam resists, X-ray resists, ion beam resists, and the like. Specific examples of organic polymeric materials include positive resists containing phenolformaldehyde resins or poly (p-vinylphenol), polymethylmethacrylate-containing resists, and the like. Examples of plasma processing residues (sidewall polymer) include among others; metal-organic complexes and/or inorganic salts, oxides, hydroxides or complexes which form films or residues either alone or in combination with the organic polymer resins of a photoresist. The organic materials and/or SWP can be removed from conventional substrates known to those skilled in the art, such as silicon, silicon dioxide, aluminum, aluminum alloys, copper, copper alloys, titanium, tungsten, alloys and their mixtures, etc.

The effectiveness and unexpected nature of the stripping compositions of the invention is illustrated, but not limited by, the data presented in the following examples. Unless otherwise specified, all parts and percentages are by weight.

EXAMPLE 1

In order to demonstrate the efficiency of the different concentrations of the stripping and cleaning compositions the following tests were conducted.

Metal/silicon wafer substrates containing commercial photoresists and plasma generated SWP residues labeled as "veils" were post-baked at 180° C. for 60 minutes. The substrates were cooled and dipped into vessels containing a stripping composition and stirred with a magnetic stirrer. One vessel contained a stripping composition maintained at a temperature of 50° C. and another at 75° C. The contact time with the compositions was 20 to 30 minutes. The substrates were washed with deionized water and dried with nitrogen. The results were determined by optical microscopy and scanning electron microscopy inspection and were as follows:

| | Example 1 % Wt Sample No. | | | | | |
|---|---|---|---|---|---|---|
| Ingredient | 1 | 2 | 3 | 4 | 5 | 7 |
| MEA | | | | 62.5% | 70.0% | |
| NMEA | 59.2% | 62.5% | 62.0% | | | |
| AEE | | | | | | 62.0% |
| HA (50%) aq sol | 33.1% | 36.5% | 38.0% | 36.5% | 20.0% | 36.0% |
| Water | | | | | 8.0% | |
| Catechol | 4.7% | | | | 2.0% | |
| Gallic Acid | | 1.0% | | 1.0% | | 2.0% |

Results

Sample 3 showed severe corrosion in VIAS at 75° C. Sample 1 and 4 in VIAS at 75° C. showed some SWP residue or corrosion. Samples 2, 4 and 7 showed better inhibitor performance against aluminum etching than other samples. Samples 2, 4 and 7 showed markedly reduced solubility of Si oxidation product.

EXAMPLE 2

The following stripping and cleaning compositions were prepared and tested according to the test of Example 1.

| Composition 1 | | Time (min) | Temp. °C. | % Polymeric Removal | Corrosion |
|---|---|---|---|---|---|
| Monoethanolamine | 60% | 20 | 65 | 100 | No |
| Hydroxylamine | 18.5% | 20 | 90 | 100 | No |
| Water | 18.5% | | | | |
| Catechol | 5% | | | | |
| Composition 2 | | | | | |
| AEE | 60% | 20 | 65 | 100 | No |
| Hydroxylamine | 18.5% | 20 | 90 | 100 | Pitting |
| Water | 18.5% | | | | |
| Catechol | 5% | | | | |
| Composition 3 | | | | | |
| AEE | 60% | 20 | 65 | 100 | No |
| HA | 18.5% | 20 | 90 | 100 | No |
| Water | 18.5% | | | | |
| Gallic Acid | 5% | | | | |

Figure 1C:
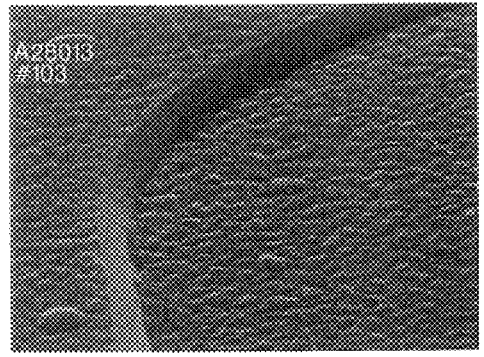
Figure 1B:
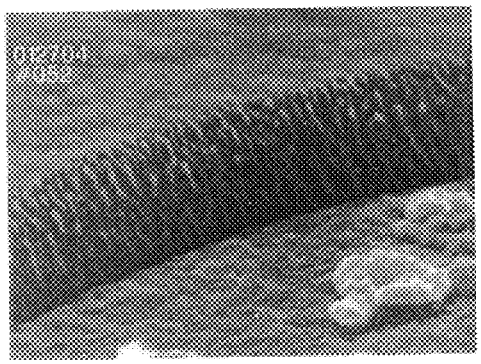
Figure 1D:
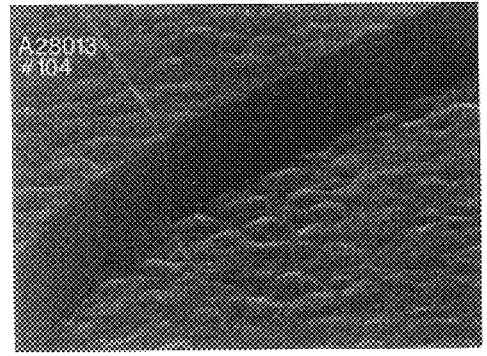

FIGS. 1A and 1B show the stripping results of composition 2 on a photoresist at 90° C. and FIGS. 1C and 1D show the results of composition 3 on a photoresist under the same conditions.

What is claimed is:

1. An aqueous stripping composition comprising an admixture of about 58 to 63% by weight of 2-(2-aminoethoxy) ethanol, about 19% by weight of hydroxylamine, about 1 to 2% by weight of gallic acid and the remainder being water.

2. A process for removing a coating from a coated substrate comprising applying to said coated substrate a stripping and cleaning effective amount of the composition of claim 1, permitting said stripping composition to reside on said coated substrate for a stripping effective period of time and removing the coating from said substrate.

* * * * *

UNITED STATES PATENT AND TRADEMARK OFFICE
CERTIFICATE OF CORRECTION

PATENT NO. : 5,928,430
DATED : July 27, 1999
INVENTOR(S) : Irl E. Ward, et. al.

It is certified that error appears in the above-identified patent and that said Letters Patent is hereby corrected as shown below:

Title page, item [73] Assignee: delete "Advanced Scientific Concepts, Inc. Santa Barbara, Calif. Ashland, Inc., Dublin, Ohio. Attorney, Agent, or firm is John Lezdey and Associates.

Signed and Sealed this

Twenty-sixth Day of December, 2000

Attest:

Q. TODD DICKINSON

Attesting Officer

Director of Patents and Trademarks